United States Patent [19]

Neppl et al.

[11] Patent Number: 4,906,585
[45] Date of Patent: Mar. 6, 1990

[54] METHOD FOR MANUFACTURING WELLS FOR CMOS TRANSISTOR CIRCUITS SEPARATED BY INSULATING TRENCHES

[75] Inventors: Franz Neppl, Muenchen; Carlos-Alb Mazure-Espejo, Kirchseeon; Christoph Zeller, Ottobrunn, all of Fed. Rep. of Germany

[73] Assignee: Siemens Aktiengesellschaft, Berlin and Munich, Fed. Rep. of Germany

[21] Appl. No.: 197,663

[22] Filed: May 20, 1988

[30] Foreign Application Priority Data

Aug. 4, 1987 [DE] Fed. Rep. of Germany ....... 3725839

[51] Int. Cl.$^4$ .................... H01L 21/265; H01L 29/94
[52] U.S. Cl. ........................................ 437/34; 437/67; 437/80
[58] Field of Search .............. 437/67, 78, 79, 34, 437/57, 80; 357/49, 50, 55

[56] References Cited

U.S. PATENT DOCUMENTS

| | | | |
|---|---|---|---|
| 4,318,759 | 3/1982 | Trenary et al. | 437/67 |
| 4,331,708 | 5/1982 | Hunter | 156/643 |
| 4,473,598 | 9/1984 | Ephrath et al. | 437/67 |
| 4,526,631 | 7/1985 | Silvestri et al. | 437/67 |
| 4,546,538 | 10/1985 | Suzuki | 156/643 |
| 4,729,964 | 3/1988 | Natsuaki et al. | 437/29 |
| 4,740,827 | 4/1988 | Niitsu et al. | 357/42 |

FOREIGN PATENT DOCUMENTS

| | | | |
|---|---|---|---|
| 60-149148 | 8/1985 | Japan | 437/67 |
| 61-63020 | 4/1986 | Japan . | |
| 2081187 | 2/1982 | United Kingdom . | |
| 2179788 | 3/1987 | United Kingdom | 437/67 |

OTHER PUBLICATIONS

Shiro Suyama et al, "A New Self-Aligned Well-Isolation Technique for CMOS Devices", IEE Transactions on Electron Devices, vol. ED-33, No. 11, Nov. 1986, pp. 1672-1677.

L. C. Parrillo et al, "Twin-Tub CMOS II-An Advanced VLSI Technology", International Electron Devices Meeting, San Francisco, California, Dec. 13-15, 1982, pp. 706-709.

Primary Examiner—Olik Chaudhuri
Attorney, Agent, or Firm—Hill, Van Santen, Steadman & Simpson

[57] ABSTRACT

A double well CMOS process wherein the wells are separated by insulating trenches introduced into a semiconductor substrate, the position of the insulating trench along the isotropic under-etching in a silicon oxide layer employed together with a silicon nitride layer used as a masking layer in the implantation of the well which is first implanted. The trench itself is produced by anisotropic etching with silicon oxide masks used in the well implantations as etching masks. The trench width is defined with the isotropic etching and the trench depth is defined by the anisotropic etching. In this method, both well implantations and the trench etching are carried out with only one photo-technique. The implantation of the second well and the trench etching are self-adjusting. As a result, minimum spacings between the active zones are provided, and a space saving design is possible. The method is used in LSI CMOS processes.

9 Claims, 4 Drawing Sheets

METHOD FOR MANUFACTURING WELLS FOR CMOS TRANSISTOR CIRCUITS SEPARATED BY INSULATING TRENCHES

BACKGROUND OF THE INVENTION

Field of the Invention

The present invention is directed to a method for manufacturing neighboring wells implanted with dopants of different conductivity types as are used for the manufacture of p-channel or n-channel or bipolar transistors in LSI CMOS circuits, the wells being arranged in a common semiconductor substrate and being separated by insulating trenches introduced into the substrate.

An adequate latch-up strength can no longer be achieved with a traditional LOCOS insulation in view of further miniaturization of CMOS components in ULSI technology (ultra large scale integration). The insulating means around the wells must be produced by etching and filling deep and narrow trenches. On the other hand, the insulating ridges within the wells should continue to remain flat in order to assure a good electrical contacting of the overall well with minimum well contact density. Two separate insulating processes are therefore needed in this technology. The process becomes more involved due to an additional photomask step for the trench etching. The adjustment tolerances also limit the amount of minitaturization possible.

In order to eliminate the additional photo technique, Sujama et al. in a report appearing in IEEE Transactions on Electron Devices, Vol. ED-33, No. 11, November, 1986, pages 1672 to 1677 propose that the well mask be employed in order to manufacture a self-adjusting aluminum mask for the trench etching in a lift-off technique. The disadvantages of this method are the stresses on the silicon substrate due to the aluminum mask, the metal contamination due to employment of aluminum in this early process stage and the appearance of high particle density due to the aluminum lift-off. Moreover, this process only permits one well implantation and a self-adjusting well process is not possible with this process.

SUMMARY OF THE INVENTION

The present invention provides a method for a double well CMOS process wherein both well implantations and the etching of the insulating trench can be performed with only a single photoresist technique. The deposition, etching and high temperature processes that are generally standard in this process technology need be the only ones employed. The methods are suitable both for an n-well process as well as for a p-well process.

The method of the present invention is characterized in that the position of the insulating trench along the well edge is defined by isotropic etching of a silicon oxide layer used together with a silicon nitride layer and lying therebelow, which is used as masking layer in the implantation of the first implanted well. The trench width is determined by the etching time of the isotropic etching and the trench etching is implemented by anisotropic etching with the silicon oxide masks used in the well implantations as etching masks, whereby the trench depth is determined by the etching time of the anisotropic etching.

In the preferred form of the invention the deep trench etching is carried out after the well implantations or the deep well etching can be performed before the implantation of the second well. In order to avoid the formation of steps in the substrate, an auxiliary layer of polycrystalline silicon may be used in the masking of the first well for the implantation of the second well, the auxiliary layer being applied to the substrate surface-wide before the silicon oxide layer to be under-etched and remaining on the surface until the trench etching.

According to an exemplary embodiment of the teaching of the invention, a thermal oxidation is carried out after the anisotropic trench etching, the dopant ions implanted into the wells also being driven in during this thermal oxidation.

In a specific embodiment of the present invention, the method proceeds as follows:

(a) a silicon substrate surface is thermally oxidized, (b) a first silicon oxide layer is applied from the vapor phase, (c) a first silicon nitride layer is applied from the vapor phase over the first silicon oxide layer, (d) a photoresist structure is applied to mask the p-well regions to be produced in the substrate, (e) the first silicon oxide/silicon nitride layers are anisotropically etched to expose n-well regions, (f) arsenic, antimony or phosphorous are implanted to generate n-wells in the n-well regions, (g) the first silicon oxide layer is isotropically under-etched to define the position of an insulating trench, (h) the photoresist mask is removed, (i) a second silicon oxide layer is applied by thermal oxidation, (j) a second silicon nitride layer is deposited and anisotropically re-etched so that the second silicon nitride layer remains in the location of the under-etching of the first silicon oxide layer, (k) a third silicon oxide layer is applied by thermal oxidation, (l) the first and second silicon nitride layers are removed, (m) boron ions are implanted for generating a p-well, (n) the second silicon oxide layer is anisotropically etched to remove the same in the locations at which insulating trenches are to appear, (o) the trenches are anisotropically etched in, (p) the first and third silicon oxide layers are removed, (q) a fourth silicon oxide layer is generated by thermal oxidation, (r) the dopant atoms implanted in the wells are thermally driven in, and (s) the trenches are filled with polycrystalline silicon from the vapor phase, the polycrystalline silicon is anisotropically re-etched, and the fourth silicon oxide layer is wet chemically re-etched.

In a modified form of the invention, method steps (n) and (o) follow method step (l) and a further silicon oxide layer is applied and etched back to form an implantation mask, method step (m) is then carried out and the further silicon oxide layer is removed in step (p).

Alternatively, a polycrystalline silicon layer is applied after step (a), the polycrystalline layer being anisotropically etched after step (l) and is removed together with the silicon oxide layer in step (p).

In specific preferred embodiments, the first silicon oxide layer has a thickness of 200 to 300 nm, the first silicon nitride layer has a thickness of 150 to 250 nm, the second silicon nitride layer has a thickness of 100 to 200 nm, the second silicon oxide layer has a thickness of 30 to 50 nm and the third silicon oxide layer has a thickness of 600 to 800 nm. The thickness of the polycrystalline silicon layer is about 200 nm.

The n-wells can be produced by phosphorus ion implantation at a dosage of $2\times10^{12}$ cm$^{-2}$ and an energy level of 180 keV. The p-wells can be produced by boron ion implantation of a dosage of $1\times10^{13}$ cm$^{-2}$ and an energy level of 180 keV. The trenches have a width preferably of about 1 um and a depth of 2 to 3 um. In the method described above, the thermal oxide simultaneously serves as a diffusion barrier in the well tempering and as an etching stop in the re-etching of the poly silicon.

The method of the present invention offers the following advantages:

1. The implantation of the second well and the trench etching are self-adjusting.
2. Minimum n+/p+ spacings exist and therefore a space saving design is possible.
3. The width of the insulating trench is independent of the resolution limit of the photomask technique.
4. The latch-up strength is increased. Latch-up can also be completely avoided on the basis of a proper selection of the trench depth.
5. Since the well tempering is not carried out until after the trench etching, segregation and mutual compensation are avoided even with a high well dopant. Field implantation and the photo technique required therefore can therefore be eliminated.
6. Mechanical stresses are avoided due to the drive-in of the wells before the trenches are completely filled up.
7. Due to the employment of polysilicon for the trench filling, a field oxide can also be subsequently generated in the region of the insulating trenches. As a result, the method can be easily inserted into the overall process.

BRIEF DESCRIPTION OF THE DRAWINGS

Further details of the invention will be set forth in greater detail with reference to three exemplary embodiments shown in FIGS. 1 through 16.

DESCRIPTION OF THE PREFERRED EMBODIMENTS

Figure 1:
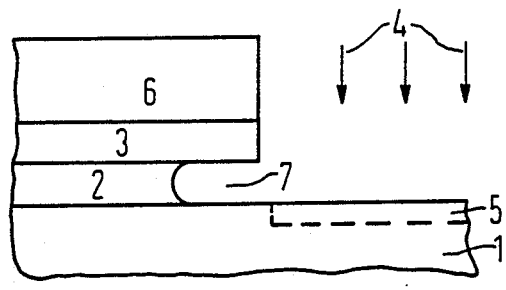
FIGS. 1 through 6 illustrate the steps involved in the method of the invention for the manufacture of an insulating trench in a double-well process, in which the deep trench etching is carried out following the well implantations.

As shown in FIG. 1, at the beginning of the n-well process, a thermal oxidation layer to a depth of about 30 nm is formed and a first oxide layer 2 is deposited on the surface of a silicon substrate 1 by thermal decomposition of tetraethylorthosilicate in a layer thickness of about 200 to 300 nm. A first silicon nitride layer 3 is applied from the vapor phase in a layer thickness in the range of about 150 to 250 nm. The implantation shown by the arrow 4 of the n-well 5 with phosphorus ions may have a dosage and energy level of $1\times10^{12}$ cm$^{-2}$ and 180 keV, respectively, and occurs after the masking of the later p-well regions 12 shown in FIG. 5 on the basis of the structuring of the double layer of silicon nitride 3/oxide layer 2 with a photoresist mask 6. The n-well regions 5 are etched with an anisotropic etching process. The step of isotropic under-etching as shown by the arrow 7 of the first SiO$_2$ layer/2 is critical to the invention. Due to the wet-chemical underetching 7 of the SiO$_2$, the position of the insulating trench 13 (FIG. 5) is defined along the well edge of the p-well 12. The trench width is determined by the etching time.

Figure 2:
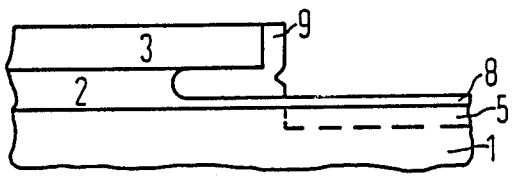

Referring to FIG. 2, a thermal oxidation is carried out after the removal of the photoresist mask 6 whereby a second silicon oxide layer 8 is generated as an intermediate oxide having a thickness of about 30 nm. A second silicon nitride layer 9 having a thickness of about 100 to 200 nm is then applied from the vapor phase and is structured with an anisotropic re-etching process such that only the trench region including the underetching 7 remains covered.

Figure 3:
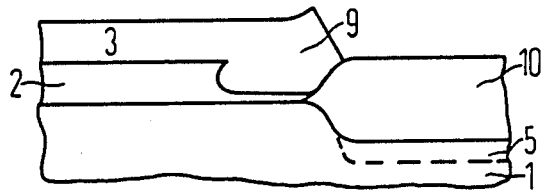

Referring to FIG. 3, with the use of the nitride layer 3, 9 as an oxidation mask, a third silicon oxide layer 10 in the range of about 600 to 800 nm thickness is generated by thermal oxidation, and is used for masking the n-well regions 5 in the later p-well implantation shown at reference numeral 12.

Figure 4:
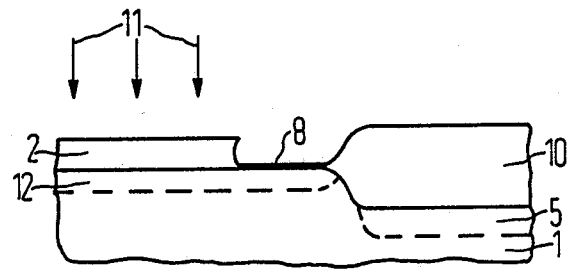

In FIG. 4, after the removal of the first and second nitride layers 3, 9 which are shown as one layer, a boron ion implantation illustrated at arrows 11 having a dosage of $1\times10^{13}$ cm$^{-2}$ and energy of 180 keV is carried out for generating the p-well 12. The first silicon oxide layer 2 serves as a scattering oxide layer.

Figure 5:
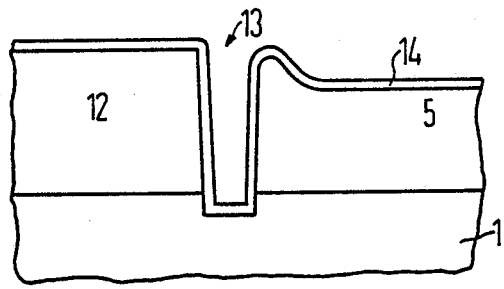

Referring to FIG. 5, after removal of the second silicon oxide layer 8 which serves as an intermediate oxide in the region of the insulating trench 13, a trench etching to provide a trench width of 1 um and a depth of 2 to 3 um is carried out with an anisotropic etching process. The oxide layers 2 and 10 which cover the wells 12 and 5 serve as etching masks. These oxide layers 5, 12 are subsequently removed and the trench 13 is covered with a thermal oxide 14 (at a thickness of 200 nm, and constituting the fourth silicon oxide layer).

Figure 6:
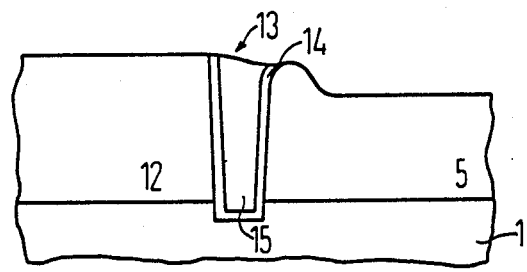

In FIG. 6 there is illustrated a temperature treatment for the well drive-in at a temperature of about 1150° C., the trenches 13 and 14 being filled with polycrystalline silicon 15 to a depth of about 500 nm. The polysilicon 15 is then anisotropically re-etched and the remaining thermal oxide 14 is removed in a wet-chemical process. The further process steps are in accordance with conventional technology.

Whereas the scattering oxide thickness in the p-well implantation 11, 12 in the embodiment just described is determined by the thickness of the first layer 2, the following embodiment permits an independent adjustment of the dispersion oxide thickness. The implantation of the p-well 11, 12 occurs after the trench etching in this case.

Figure 7:
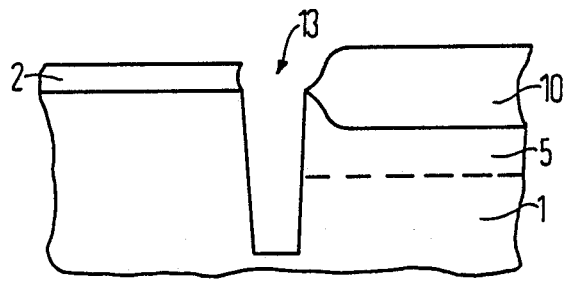
FIGS. 7 through 9 illustrate an embodiment wherein the deep trench etching is carried out before the implantation of the second well.

In the embodiment shown in FIG. 7, up to and including the method steps 3, 9 provided for the nitride layer structures, the process follows the exemplary embodiment set forth in FIGS. 1 through 3. However, the boron ion implantation for generating the p-well 12 is not performed first but the trench 13 is etched after anisotropic removal of the intermediate oxide 8. FIG. 7 shows the arrangement following the trench etching.

Figure 8:
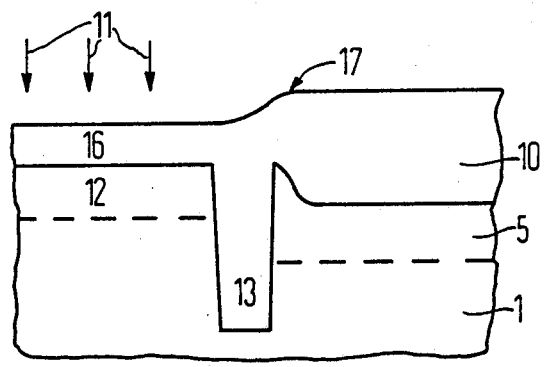

Referring to FIG. 8, the SiO$_2$ serving as the dispersion oxide is formed on a substrate surface by depositing and re-etching a thermally decomposed tetraethylorthosilicate layer 16. This layer 16 simultaneously serves the purpose of masking the trench floor 13 in the following boron ion implantation 11 for generating the p-well 12. This implantation can occur at a concentration of $1\times10^{13}$ cm$^{-2}$, and an energy of 180 keV. The masking oxide 16 on the n-well is thickened along the well edge as shown by the arrow 17, whereby a possible compensation of the n-well 5 is prevented in this region.

Figure 9:
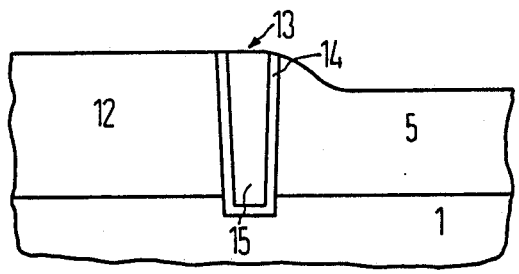

As shown in FIG. 9, the chemical vapor deposited oxide 16 is now wet-chemically removed and the thermal oxidation for generating the fourth SiO$_2$ layer 14, the tempering for the well drive-in and the filling of the trench with polycrystalline silicon 15 are carried out as shown in FIG. 6.

A step in the silicon substrate that can lead to focusing problems in later photoresist techniques is formed in the masking of the n-well 5 due to the thermal oxidation layer 10. In order to avoid this step, a polycrystalline layer 18 is used under the first silicon oxide/first silicon nitride layer 2, 3 as an auxiliary layer in a further embodiment of the invention. The masking of the n-well 5 then occurs by thermal oxidation of this polysilicon layer 18 to form SiO$_2$ layer 10.

Figure 10:
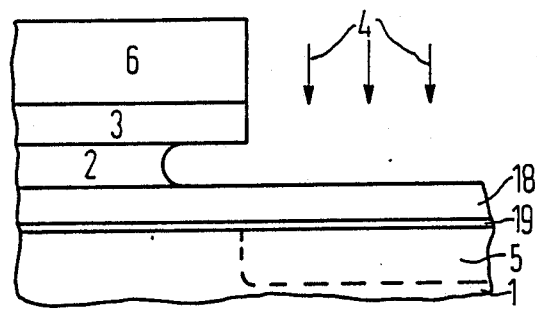
FIGS. 10 through 16 illustrate the steps involved in the method of the invention for manufacturing an insulating trench wherein an auxiliary layer of polysilicon is employed.

The method steps as described in FIG. 1 are carried out and, in addition, an auxiliary layer 18 composed of a polycrystalline silicon having a layer thickness of 200 nm is additionally applied after the thermal oxidation at the beginning of the n-well process sequence by means of thermal decomposition of a silicon-containing gaseous compound. The SiO$_2$ layer of about 30 nm thickness produced by thermal oxidation of the surface is identified by reference numeral 19 in FIG. 10.

Figure 11:
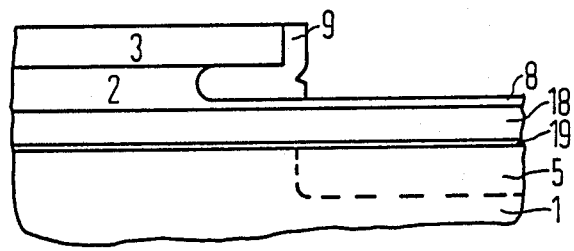

FIG. 11 illustrates that after the removal of the photoresist mask 6, the second nitride layer 9 is deposited and etched back as shown in FIG. 2.

Figure 12:
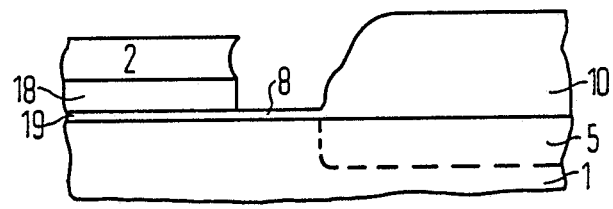

After the thermal oxidation has been carried out, and the third silicon oxide layer 10 of about 600 nm results from the exposed polysilicon layer 18, the nitride mask 3, 9 is removed and the polysilicon layer 18 is anisotropically etched in the trench region. The structure is illustrated in FIG. 12.

Figure 13:
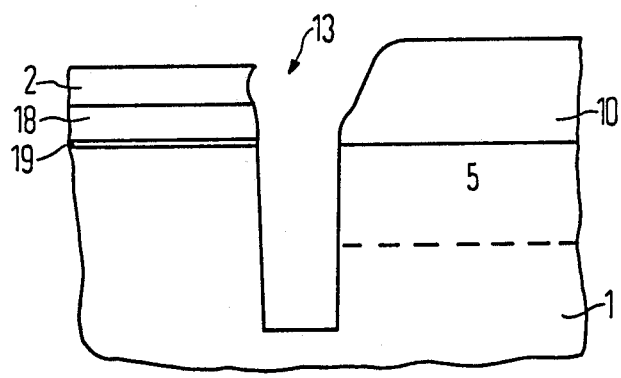

The intermediate oxide 8 in the trench region is then removed and the trench is etched in the manner already set forth. The resulting structure is shown in FIG. 13.

Figure 14:
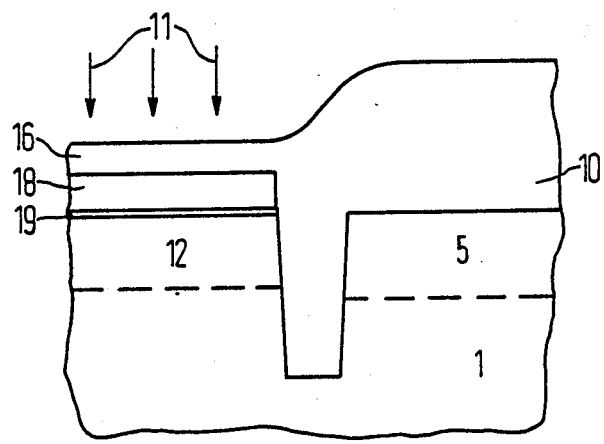

FIG. 14 illustrates a dispersion oxide 16 required for the boron ion implantation 11 for generating the p-well 12 can be produced by deposition of SiO$_2$ from the vapor phase as set forth in FIG. 8.

Figure 15:
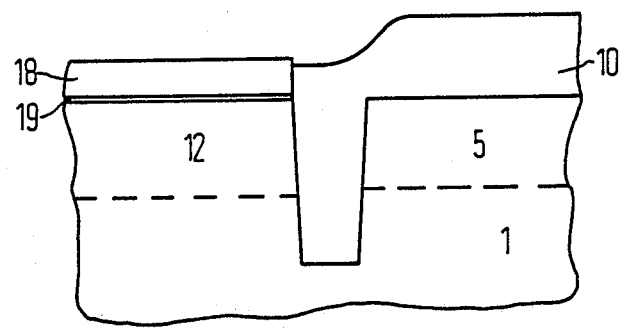

FIG. 15 shows the arrangement after the re-etching of the oxide layer 16.

Figure 16:
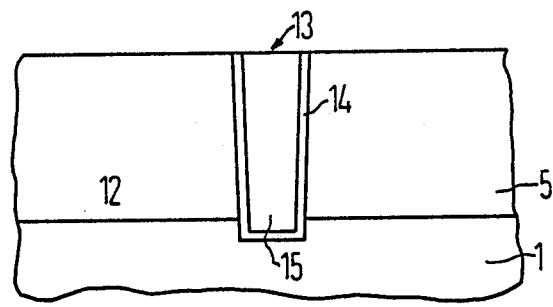

The remaining polysilicon layer 18 and the oxide layers 10 and 19 are then wet-chemically removed. All further process steps have already been set forth in detail in FIGS. 5, 6, or 9. As may be seen from FIG. 16, the employment of the polysilicon auxiliary layer 18 and the specific process sequence in this exemplary embodiment achieves a leveling of the substrate surface in comparison to the exemplary embodiments set forth previously.

It will be evident that various modifications can be made to the described embodiments without departing from the scope of the present invention.

We claim:

1. In a method for the manufacture of neighboring wells with dopants of different conductivity type, the wells being arranged in a common semiconductor substrate and being separated by insulating trenches formed in said substrate comprising the steps of:
    generating on the substrate a polysilicon layer;
    generating on the polysilicon layer a silicon oxide layer;
    generating on the silicon oxide layer a silicon nitride layer;
    depositing on the silicon nitride layer a photosensitive resist layer; utilizing a phototechnique to structure the silicon nitride layer and the silicon oxide layer so that the polysilicon layer is exposed in an area of a well to be implanted first,
    utilizing the silicon nitride layer and silicon oxide layer as a masking layer in the implantation of the first well,
    after implantation, the silicon oxide layer arranged between the silicon nitride layer and the polysilicon layer is isotropically etched; and
    etching a trench anisotropically utilizing the etched silicon oxide layer as an etching mask, the trench depth being determined by the etching time of said anisotropic etching of the trench etching and the trench width being controlled by the etching time of the isotropic etching of the silicon oxide layer, and forming a layer of silicon oxide to mask said first well for the implantation of a second well.

2. A method according to claim 1 which includes the step of thermal oxidation after the anisotropic trench etching, said thermal oxidation serving to drive in dopant ions implanted into said wells.

3. A method according to claim 1 wherein the silicon oxide on the polysilicon layer is produced by thermal decomposition of tetraethylorthosilicate.

4. A method for the manufacture of a double-well transistor assembly comprising the following steps in the order given:
    (a) thermally oxidizing a silicon substrate surface and applying a polycrystalline silicon layer on a resultant thermally oxidized silicon substrate surface,
    (b) applying a first silicon oxide layer from the vapor phase onto the polycrystalline silicon layer,
    (c) applying a first silicon nitride layer from the vapor phase over said first silicon oxide layer,
    (d) applying a photoresist structure to mask the p-well regions to be produced in said substrate;
    (e) anisotropically etching the first silicon oxide/silicon nitride layers to expose n-well regions,
    (f) implanting arsenic, antimony, or phosphorus to generate n-wells in said n-well regions,
    (g) isotropically under-etching said first silicon oxide layer to define the position of an insulating trench,
    (h) removing said photoresist mask;
    (i) forming a second silicon oxide layer by thermal oxidation of a surface of the polycrystalline silicon layer,
    (j) depositing a second silicon nitride layer and anisotropically re-etching said second silicon nitride layer so that said second silicon nitride layer remains in the location of the under-etching of said first silicon oxide layer,
    (k) forming a third silicon oxide layer by thermal oxidation of the polycrystalline silicon not masked by the first and second silicon nitride layers,
    (l) removing said first and second silicon nitride layers and then anisotropically etching said polycrystalline silicon layer using the first silicon oxide layer and the third silicon oxide layer as mask,
    (m) performing boron-ion implantation for generating a p-well, (n) anisotropically etching to remove said second silicon oxide layer in the locations at which insulating trenches are to appear,
(o) anisotropically etching the trenches in the substrate,
(p) removing said first and third silicon oxide layers and remaining polycrystalline layer,
(q) generating a fourth silicon oxide layer on the substrate by thermal oxidation,
(r) thermally driving in dopant atoms implanted in the wells, and
(s) filling said trenches with polycrystalline silicon from the vapor phase, anisotropically re-etching the polycrystalline silicon, and wet-chemically re-etching said fourth silicon oxide layer remaining on said substrate.

5. A method according to claim 4 wherein said first silicon oxide layer has a thickness of 200 to 300 nm, said first silicon nitride layer has a thickness of 150 to 250 nm, said second silicon nitride layer has a thickness of 100 to 200 nm, said second silicon oxide layer has a thickness of 30 to 50 nm, and said third silicon oxide layer has a thickness of 600 to 800 nm and said polycrystalline silicon layer that is applied to the oxidized surface of the silicon substrate under the first silicon oxide layer has a thickness of about 200 nm.

6. A method according to claim 4 wherein said n-wells are produced by phosphorus ion implantation at a dosage of $2 \times 10^{12}$ cm$^{-2}$ and an energy level of 180 keV, and said p-wells are produced by boron ion implantation at a dosage of $1 \times 10^{13}$ cm$^{-2}$ and an energy level of 180 kev.

7. A method according to claim 4 wherein said trenches have a width of about 1 um and a depth of 2 to 3 um.

8. A method according to claim 4, wherein said isotropic etching of said silicon oxide layer is performed by a wet chemical process.

9. A method for the manufacture of a double-well transistor assembly comprising the following steps in the order given:
   (a) thermally oxidizing a silicon substrate surface and applying on a resultant thermally oxidized substrate surface a polycrystalline silicon layer,
   (b) applying a first silicon oxide layer from the vapor phase onto the polycrystalline silicon layer,
   (c) applying a first silicon nitride layer from the vapor phase over said first silicon oxide layer,
   (d) applying a photoresist structure to mask the p-well regions to be produced in said substrate,
   (e) anisotropically etching the first silicon oxide/silicon nitride layers to expose n-well regions,
   (f) implanting arsenic, antimony, or phosphorus to generate n-wells in said n-wells regions,
   (g) isotropically under-etching said first silicon oxide layer to define the position of an insulating trench,
   (h) removing said photoresist mask,
   (i) forming a second silicon oxide layer by thermal oxidation of a surface of the polycrystalline silicon layer,
   (j) depositing a second silicon nitride layer and anisotropically re-etching said second silicon nitride layer so that said second silicon nitride layer remains in the location of the under-etching of said first silicon oxide layer,
   (k) forming a third silicon oxide layer by thermal oxidation of the polycrystalline silicon not masked by the first and second silicon nitride layers,
   (l) removing said first and second silicon nitride layers,
   (m) anisotropically etching to remove said second silicon oxide layer in the locations at which insulating trenches are to appear,
   (n) anisotropically etching the trenches in the substrate,
   (o) applying a further silicon oxide layer on the substrate and etching same back to form an implantation mask,
   (p) performing boron-ion implantation for generating a p-well,
   (q) removing said first, third, and further silicon oxide layers,
   (r) generating a fourth silicon oxide layer on the substrate by thermal oxidation,
   (s) thermally driving in dopant atoms implanted in the wells, and
   (t) filling said trenches with polycrystalline silicon from the vapor phase, anisotropically re-etching the polycrystalline silicon, and wet-chemically re-etching said fourth silicon oxide layer remaining on said substrate.

* * * * *